United States Patent
Chen et al.

(10) Patent No.: US 10,063,763 B2
(45) Date of Patent: Aug. 28, 2018

(54) CAMERA MODULE

(71) Applicant: VisEra Technologies Company Limited, Hsin-Chu (TW)

(72) Inventors: Chin-Fu Chen, Hsinchu (TW); I-Pei Liu, Zhubei (TW)

(73) Assignee: TDK TAIWAN CORP., Yangmei Taoyuan (TW)

( * ) Notice: Subject to any disclaimer, the term of this patent is extended or adjusted under 35 U.S.C. 154(b) by 0 days.

(21) Appl. No.: 15/204,313

(22) Filed: Jul. 7, 2016

(65) Prior Publication Data

US 2018/0013948 A1    Jan. 11, 2018

(51) Int. Cl.
*H04N 5/232* (2006.01)
*H01L 27/146* (2006.01)
*H04N 5/369* (2011.01)

(52) U.S. Cl.
CPC ..... *H04N 5/23212* (2013.01); *H01L 27/1464* (2013.01); *H01L 27/14627* (2013.01); *H01L 27/14643* (2013.01); *H04N 5/3696* (2013.01)

(58) Field of Classification Search
CPC ......... H01L 27/14818; H01L 27/14623; H01L 27/1462
USPC ........................................................ 348/342
See application file for complete search history.

(56) References Cited

U.S. PATENT DOCUMENTS

| | | | |
|---|---|---|---|
| 2013/0118685 A1* | 5/2013 | Hara | G02B 3/0031 156/309.6 |
| 2013/0182136 A1 | 7/2013 | Ishizue | |
| 2013/0182173 A1* | 7/2013 | Murata | H01L 27/14605 348/349 |
| 2015/0062028 A1* | 3/2015 | Go | G06F 1/1616 345/173 |
| 2016/0050359 A1* | 2/2016 | Nakata | H01L 27/14621 250/201.2 |

FOREIGN PATENT DOCUMENTS

| | | | |
|---|---|---|---|
| JP | 55-111928 A | 8/1980 | |
| JP | 2006173177 A | 6/2006 | |
| JP | 2015-050331 A | 3/2015 | |
| JP | 2015162562 A | 9/2015 | |
| TW | 201123368 A | 7/2011 | |
| TW | 201622126 * | 6/2016 | ........... H01L 27/146 |
| TW | 201622126 A | 6/2016 | |
| WO | WO 2014/156659 A1 | 10/2014 | |
| WO | WO 2014/208047 A1 | 12/2014 | |

(Continued)

OTHER PUBLICATIONS

An Office Action from corresponding TW Application No. 105126059 dated Feb. 13, 2017; 7 pgs.

(Continued)

*Primary Examiner* — Lin Ye
*Assistant Examiner* — Chan T Nguyen
(74) *Attorney, Agent, or Firm* — Muncy, Geissler, Olds & Lowe, PC (57) ABSTRACT

A camera module includes a transparent plate, a top sensing layer, and a light-cutting layer. The transparent plate includes a bottom surface and a top surface opposite to the bottom surface. The top sensing layer is formed on the bottom surface. The light-cutting layer is formed on the top surface, and includes a blocking material and transparent apertures penetrating through the blocking material.

15 Claims, 7 Drawing Sheets

(56) References Cited

FOREIGN PATENT DOCUMENTS

| WO | WO 2015/130226 A1 | 9/2015 |
| WO | WO 2015/039152 A1 | 3/2016 |
| WO | WO 2016/072281 A1 | 5/2016 |

OTHER PUBLICATIONS

An Office Action from corresponding JP Application No. 2016-210297 dated Jun. 26, 2017; 12 pgs. with translation.

* cited by examiner

CAMERA MODULE

BACKGROUND OF THE INVENTION

Field of the Invention

The present disclosure relates to a camera module, and in particular to a camera module with phase-difference-detection-autofocus functions.

Description of the Related Art

In general, a digital camera utilizes an image sensor to sense an incident light beam and generate an image signal, and thus a picture taken by the digital camera can be generated according to the image signal.

As digital cameras continue to develop, both image quality and auto-focus speed are increasingly demanded. A phase-difference-detection-autofocus technique utilizes the phase difference detection pixels to form a pair of images. By measuring an interval between two images, an out-of-focus distance can be calculated. On the basis of the calculated moving distance, focus control is directly performed by adjusting the position of the lens, which is faster than a contrast autofocus technique.

In some cases, the phase difference detection pixels are arranged in a separated autofocus sensors. The digital camera, in general, is equipped with a beam splitter to divide light to an image sensor and to a separated autofocus sensor, respectively. Auto-focusing is carried out by comparing the phase difference of the image with two sensors.

Moreover, in some cases, the phase difference detection pixels are integrated within the image sensor, and are partially optically shielded in an angle of view and acquiring phase difference signals from those pixels. As a result, a portion of the incident light beam is not entering the image sensor owing to either being guided away or being shielded. Thus the photosensitivity of the image sensor is decreased and affects the image quality.

Consequently, it is desirable to provide a solution to improve digital cameras and image sensors. In the present invention, the image sensor has the phase-difference-detection-autofocus technique, and the photosensitivity of the image sensor is not decreased since the incident light beam is not separated or shielded. Moreover, the photosensitivity of the phase difference detection pixels of the image sensor is increased by decreasing the length of the path of the incident light beam to the phase difference detection pixels.

BRIEF SUMMARY OF THE INVENTION

The present disclosure provides camera module for improving the photosensitivity of the image sensor.

The present disclosure provides a camera module including a transparent plate, a top sensing layer, and a light-cutting layer. The transparent plate includes a bottom surface and a top surface opposite to the bottom surface. The top sensing layer is formed on the bottom surface. The light-cutting layer is formed on the top surface, and includes a blocking material and transparent apertures penetrating through the blocking material.

In some embodiments, the top sensing layer comprises an invisible-light-cutting film and a plurality of top sensing units penetrating through the invisible-light-cutting film.

In some embodiments, the top sensing units are arranged in sets of two and each set of two top sensing units for use together, wherein each set of two top sensing units includes a first top sensing unit and a second top sensing unit. The first top sensing unit is configured to generate a first focus signal and the second top sensing unit is configured to generate a second focus signal. A focus value is obtained by a processing module according to the first focus signal and the second focus signal.

In some embodiments, two sets of top sensing units define an invisible-light-cutting zone. Each of the invisible-light-cutting zones is located under one of the transparent apertures. The area of the invisible-light-cutting zone is greater than the area of the transparent aperture. The center of the invisible-light-cutting zone is aligned with a center of the transparent aperture.

In some embodiments, the top sensing units are electrically connected to a processing module via a substrate located under the top sensing layer.

In some embodiments, the top sensing units are organic photodiodes, and configured to sense invisible light, wherein the top sensing units connected to a plurality of transparent wires, and the top sensing units are electrically connected to a processing module via the transparent wires.

In some embodiments, the invisible light is infrared light having wavelengths greater than 800 nm. The invisible light is ultraviolet light having wavelengths less than 400 nm. The transparent wires are made of ITO. The widths of the top sensing units are about 20 times the widths of the transparent wires.

In some embodiments, the sensing device further includes a sensing device, filter units and microlenses. The sensing device includes bottom sensing units configured to generate image signals. The filter units are disposed on the bottom sensing units. The microlenses are disposed on the filter units. The top sensing layer is located over the microlenses.

In some embodiments, the camera module further includes a lens located over the light-cutting layer. The top sensing layer includes top sensing units configured to generate focus signals and the lens is moved according to the focus signals.

In conclusion, the incident light beams passes through the protection structure to the sensing device, and the top sensing layer of the protection structure provides phase-difference-detection-autofocus functions. Therefore, a portion of the incident light beams is not guided to a conventional autofocus sensor, and the photosensitivity of the sensing device is improved. Moreover the photosensitivity of the top sensing layer is also improved.

BRIEF DESCRIPTION OF THE DRAWINGS

The invention can be more fully understood by reading the subsequent detailed description and examples with references male to the accompanying drawings, therein.

DETAILED DESCRIPTION OF THE INVENTION

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale, or the drawings may be otherwise simplified for clarity of discussion, as they are intended merely for illustration.

Figure 1:
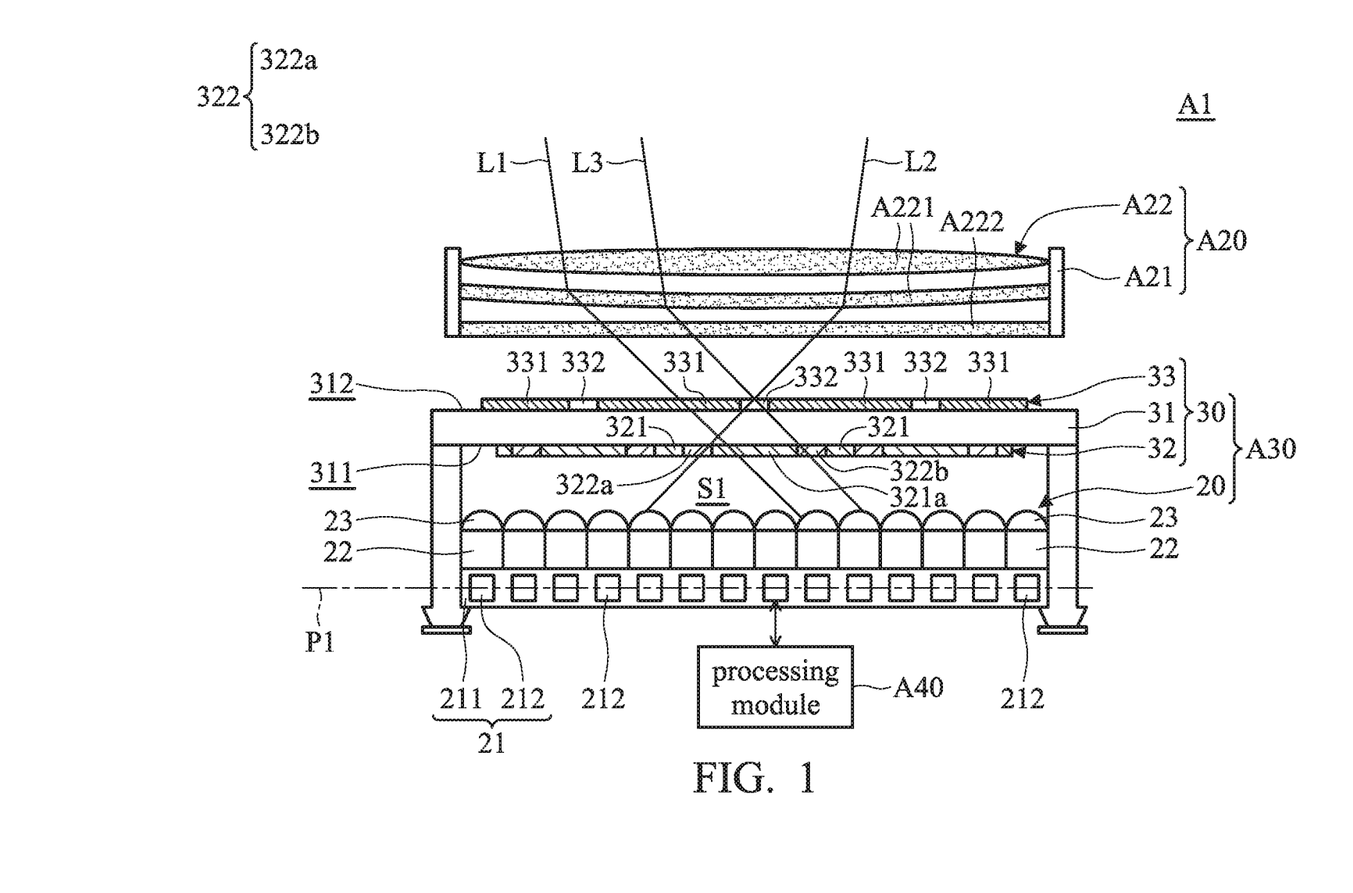
FIG. 1 is a schematic view of an image capturing apparatus in accordance with some embodiments of the present disclosure.
Figure 2:
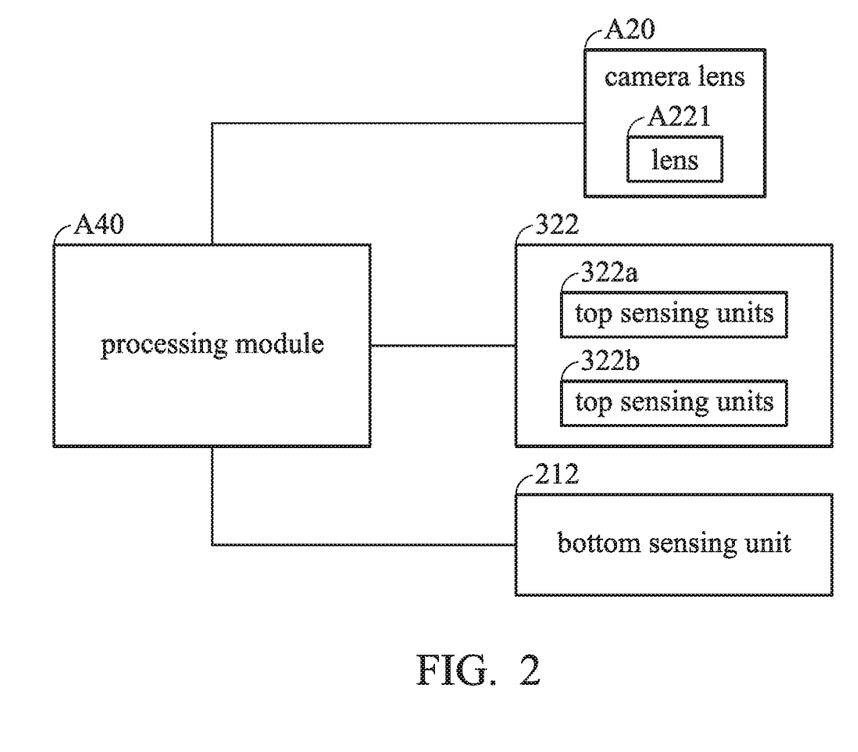
FIG. 2 is a system diagram of the image capturing apparatus in accordance with some embodiments of the present disclosure.

FIG. 1 is a schematic view of an image capturing apparatus A1 in accordance with some embodiments of the present disclosure. FIG. 2 is a system diagram of the image capturing apparatus A1 in accordance with some embodiments of the present disclosure. In some embodiments, the image capturing apparatus A1 is an electronic device with a photographic function, such as a camera, a mobile phone, or a computer. The image capturing apparatus A1 provides phase-difference-detection-autofocus functions for increasing the focus speed of taking an image from an object.

The image capturing apparatus A1 includes a camera lens A20, a camera module A30, and a processing module A40. The camera lens A20 is disposed over the camera module A30. The camera lens A20 may include a lens housing A21 and a lens assembly A22. The lens assembly A22 is disposed in the lens housing A21.

The lens assembly A22 includes one or more lenses A221 and a protection lens A222. The lenses A221 are configured to focus a light beam on the camera module A30. The protection lens A222 is a plate structure, and is configured to protect the lenses A221.

The camera module A30 is configured to capture an image from an object. The processing module A40 is electrically connected to the camera module A30 and the camera lens A20. In some embodiments, the processing module A40 is a processing chip.

The camera module A30 includes a sensing device 20, and a protection structure 30. The sensing device 20 is configured to detect an incident light beam and generate image signals according to the light beam falling on the sensing device 20. The protection structure 30 is located over the sensing device 20.

In some embodiments, the sensing device 20 is a CMOS (Complementary Metal-Oxide-Semiconductor) image sensor. In some embodiments, the sensing device 20 is a FSI (Frontside illumination) or BSI (backside illumination) CMOS image sensor, or another suitable sensor.

As shown in FIG. 1, the protection structure 30 is separated from the sensing device 20. In other words, a space S1 is located between the protection structure 30 and the sensing device 20. In some embodiments, the space S1 is filled with gas or a transparent material. The protection structure 30 is configured to protect the sensing device 20 and provide phase-difference-detection-autofocus functions. In some embodiments, the protection structure 30 is a plate structure.

The sensing device 20 includes a sensing layer 21, filter units 22, and microlenses 23. The sensing layer 21 extends along a reference plane P1. The sensing layer 21 may include all of the following elements, but the sensing layer 21 does not necessarily include all of the following elements, as long as the objective of the sensing layer 21 is achieved.

The sensing layer 21 includes a substrate 211 and bottom sensing units 212. In some embodiments, the sensing layer 21 also includes other optional layers, such as a dielectric layer or an anti-reflection layer (not shown in figures).

The bottom sensing units 212 are disposed in the substrate 211. The bottom sensing units 212 are arranged in a sensing array along the reference plane P1. In some embodiments, the bottom sensing units 212 are photodiodes. Each of the bottom sensing units 212 is configured to sense the light beam and generate an image signal according to the intensity of the light beam falling thereon. The processing module A40 is electrically connected to the bottom sensing units 212, and receives the image signals. An image can be generated by the processing module A40 according to the image signals.

The filter units 22 are disposed on the sensing layer 21. The filter units 22 are arranged in a filter array on a plane that is parallel to the reference plane P1. Each of the filter units 22 is disposed over one of the bottom sensing units 212.

Each of the filter units 22 allows a predetermined range of wavelengths of light to pass through. In some embodiments, the filter units 22 are color filter units. The filter units 22 include red filter units, green filter units, and blue filter units. The red filter units, the green filter units, and the blue filter units are alternately arranged in the filter array.

The red filter unit allows wavelengths of light in a range from 620 nm to 750 nm (red light) to pass to the bottom sensing unit 212. The green filter unit allows wavelengths of light in a range from 495 nm to 570 nm (green light) to pass to the bottom sensing unit 212. The blue filter unit allows wavelengths of light in a range from 425 nm to 495 nm (blue light) to pass to the bottom sensing unit 212.

The microlenses 23 are aligned to the filter units 22. Each of the microlenses 23 is disposed on one of the filter units 22. The microlenses 23 are arranged in a microlens array on a plane that is parallel to the reference plane P1. The microlenses 23 are configured to focus light to the bottom sensing units 212.

Figure 3A:
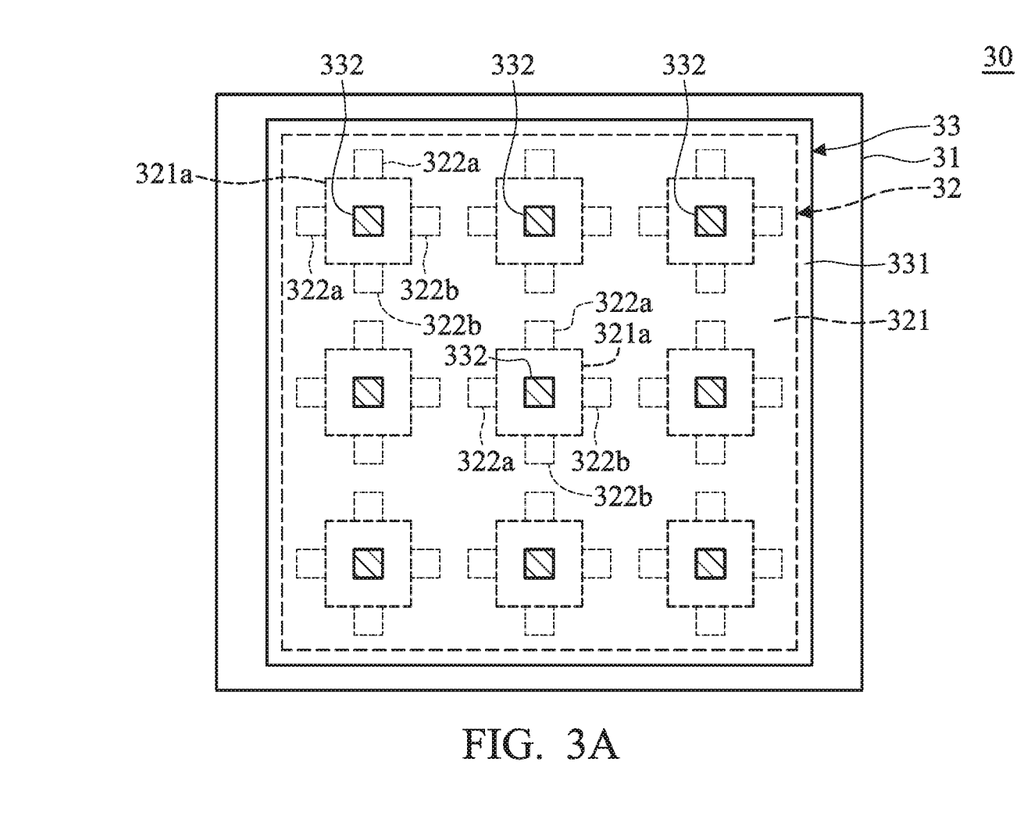
FIG. 3A is a top view of the protection structure in accordance with some embodiments of the present disclosure.
Figure 3B:
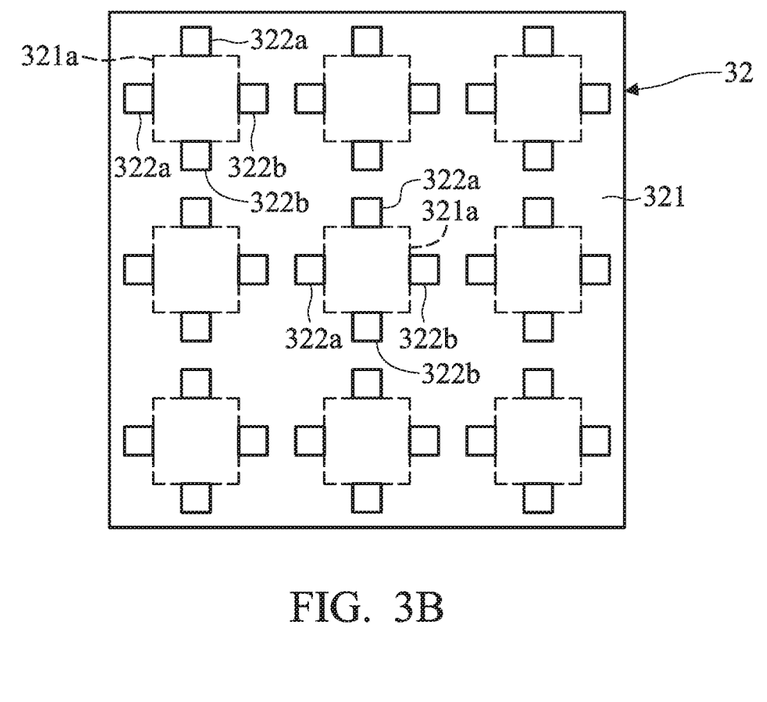
FIG. 3B is a top view of the top sensing layer in accordance with some embodiments of the present disclosure.
Figure 3C:
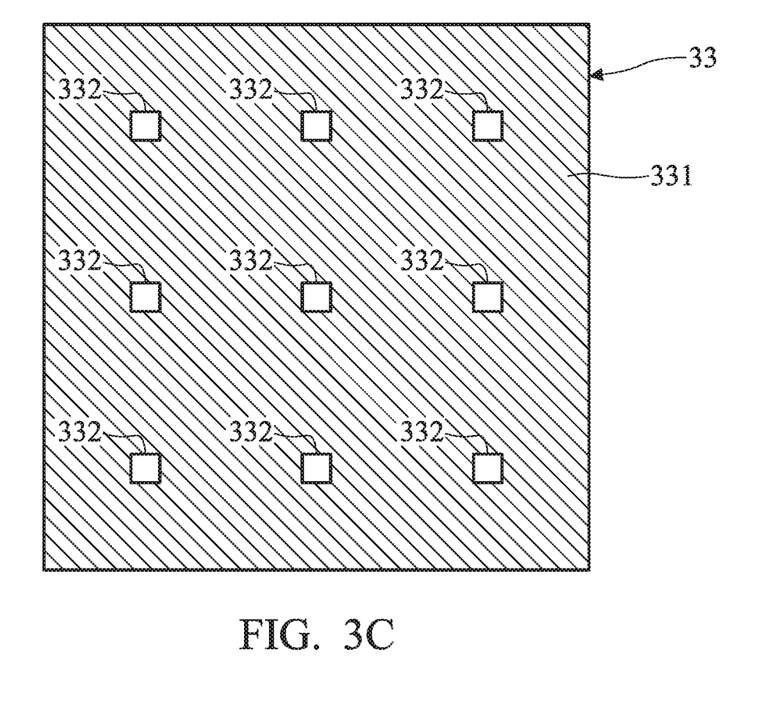
FIG. 3C is a top view of the light-cutting layer in accordance with some embodiments of the present disclosure.

FIG. 3A is a top view of the protection structure 30 in accordance with some embodiments of the present disclosure. FIG. 3B is a top view of the top sensing layer 32 in accordance with some embodiments of the present disclosure. FIG. 3C is a top view of the light-cutting layer 33 in accordance with some embodiments of the present disclosure. The protection structure 30 includes a transparent plate 31, a top sensing layer 32, and a light-cutting layer 33.

The transparent plate 31 is a plate structure parallel to the reference plane P1. In some embodiments, the transparent plate 31 is made of glass. The transparent plate 31 has a bottom surface 311 and a top surface 312 opposite to the bottom surface 311.

The top sensing layer 32 is formed on the bottom surface 311 and faces the sensing device 20. The top sensing layer 32 is located over the microlenses 23. As shown in FIG. 1, the top sensing layer 32 is separated from the microlenses 23. The space S1 is located between the top sensing layer 32 and the microlenses 23.

The top sensing layer 32 includes an invisible-light-cutting film 321 and top sensing units 322. The invisible-light-cutting film 321 is configured to block the invisible component of the light beam, and allow the visible component of the light beam to pass. The invisible component corresponds to infrared light having wavelengths greater than 800 nm or ultraviolet light having wavelengths less than 400 nm. The visible component corresponds to visible light. In this embodiment, the invisible component corresponds to infrared light.

The top sensing units 322 are surrounded by the invisible-light-cutting film 321. The top sensing units 322 are transparent. The top sensing units 322 are arranged in a sensing array. In some embodiments, the size of the top sensing units 322 is greater than the size of the bottom sensing units 212. The number of the top sensing units 322 is less than the number of the bottom sensing units 212.

In some embodiments, the top sensing units 322 are organic photodiodes or IR organic photodiodes. The top sensing units 322 is configured to generate focus signals according to the light beam falling on the top sensing units 322.

In some embodiments, the top sensing units 322 are configured to sense infrared light or ultraviolet light. The top sensing units 322 generate focus signals according to the invisible component (the infrared component or the ultraviolet component) of the light beam falling on the top sensing units 322. The processing module A40 is electrically connected to the top sensing units 322, and receives the focus signals.

Figure 4:
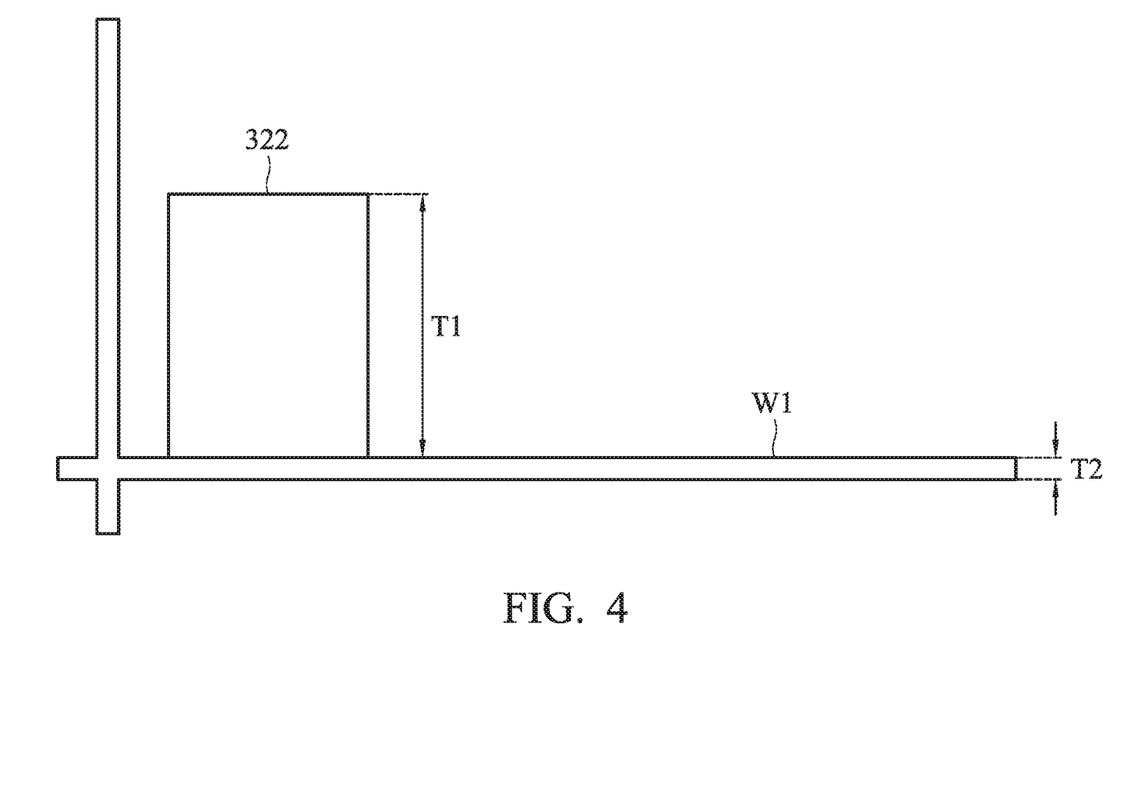
FIG. 4 is a schematic view of top sensing units and transparent wires in accordance with some embodiments of the present disclosure.

As shown in FIGS. 1, 2 and 4, the top sensing units 322 are electrically connected to the processing module A40 via the transparent wires wt and the substrate 211 located under the top sensing layer 32. In some embodiments, the width T1 of the top sensing unit 322 is about 20 um. The width T2 of the transparent wire w1 is about 1 um. The width T1 of the top sensing unit 322 is about 20 times the width T2 of the transparent wire w1. The width T1 and the width T2 are measured parallel to the reference plane P1 as shown in FIG. 1.

In some embodiments, the transparent wire w1 is made of ITO (Indium Tin Oxide). The transparent wire w1 allows the wavelengths of light beam in a range from about 400 nm to 800 nm to pass therethrough. The light transmittance of the transparent wire w1 is about 90%. Therefore, the light loss of the top sensing layer 32 is about 1%.

The light-cutting layer 33 is formed on the top surface 312. The lenses A221 are located over the light-cutting layer 33. The light-cutting layer 33 includes a blocking material 331 and transparent apertures 332. The blocking material 331 is located over the top sensing units 322. The blocking material 331 is configured to block the invisible component of the light beam, and allow the visible component of the light beam to pass.

The transparent apertures 332 penetrate through the blocking material 331 and located over the invisible-light-cutting film 321 of the top sensing layer 32. The transparent apertures 332 are arranged in an aperture array. The transparent apertures 332 allow all of the components (visible and invisible components) of the light beam to pass. In some embodiments, the materials of the blocking material 331 or the transparent apertures 332 may the same or different, when the materials of the blocking material 331 or the transparent apertures 332 can block the invisible components of the light beam.

As shown in FIGS. 1 and 2, the invisible-light-cutting film 321 includes invisible-light-cutting zones 321a. The top sensing units 322 include pairs of top sensing units 322a and 322b. Each pair of top sensing units 322a and 322b has phase differences. Each of the invisible-light-cutting zones 321a is located between one or two pairs of top sensing units 322a and 322b. Each of the transparent apertures 332 is located over one of the invisible-light-cutting zones 321a. Each area of the invisible-light-cutting zones 321a is greater than each area of the transparent apertures 332.

As shown in FIG. 1, by the top sensing layer 32 and the light-cutting layer 33, the invisible component of the light beam L1 is blocked before the light beam L1 falling on the sensing device 20. Therefore, the quality of the image is not affected by the invisible component of the light beam L1.

In some embodiments, the top sensing units 322 are phase difference detection pixels. A phase-difference-detection-autofocus technique utilizes the top sensing units 322 to form a pair of images.

As shown in FIGS. 1 and 2, a light beam L2 passes through the transparent apertures 332, and then passes through the top sensing unit 322a. Since the light beam L2 does not pass through the blocking material 331, the invisible component of the light beam L2 is not be blocked. In other words, the light beam L2 falls on the top sensing unit 322a includes the visible and invisible components.

The top sensing units 322a generate first focus signals according to the invisible component of the light beam L2 falling on the top sensing units 322a. Moreover, the visible component of the light beam L2 passes through the top sensing layer 32, the microlenses 23, and the filter units 22, and falls on the bottom sensing units 212.

Similarly, a light beam L3 passes through the same transparent apertures 332, and then passes through the top sensing unit 322b. Since the light beam L3 does not pass through the blocking material 331, the invisible component of the light beam L3 is not be blocked. In other words, the light beam L3 falls on the top sensing unit 322b includes the visible and invisible components. The top sensing units 322b generate second focus signals according to the invisible component of the light beam L3 falling on the top sensing units 322b. Moreover, the visible component of the light beam L3 passes through the top sensing layer 32, the microlenses 23, and the filter units 22, and falls on the bottom sensing units 212.

Figure 5:
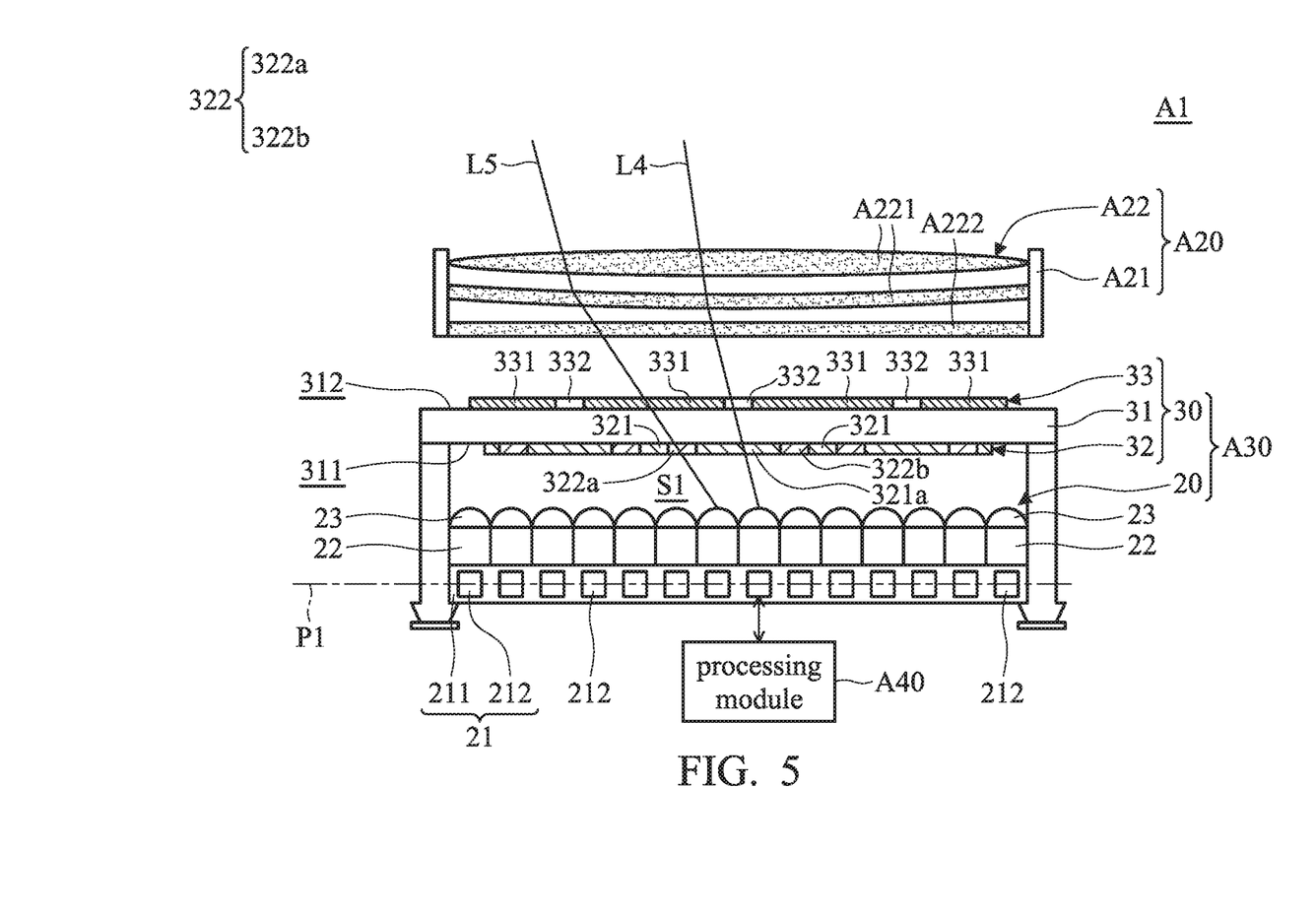
FIG. 5 is a schematic view of an image capturing apparatus in accordance with some embodiments of the present disclosure.

As shown in FIG. 5, a light beam L4 includes the visible and invisible components. The visible and invisible components of the light beam L4 passes through the transparent apertures 332. The invisible component of the light beam L4 falls on the invisible-light-cutting film 321, and is blocked by the invisible-light-cutting film 321. The visible component of the light beam L4 passes through the invisible-light-cutting film 321, the microlenses 23, and the filter units 22, and falls on the bottom sensing units 212.

In addition, a light beam L5 includes the visible and invisible components. The invisible component of the light beam L5 falls on the blocking material 331, and is blocked by the blocking material 331. The visible component of the light beam L5 passes through the blocking material 331, the top sensing unit 322a (or top sensing unit 322b), the microlenses 23, and the filter units 22, and falls on the bottom sensing units 212.

The processing module A40 obtains focus values according to the first focus signals and the second focus signals. Afterwards, the processing module A40 controls the lens assembly A22 to move the lenses A221 relative to the sensing device 20 according to the focus values.

In addition, since the visible components of the light beams L2 and L3 can pass through the top sensing units 322a and 322b, the quality of the image is not affected by the top sensing units 322a and 322b.

In conclusion, the incident light beams passes through the protection structure to the sensing device, and the top sensing layer of the protection structure provides phase-difference-detection-autofocus functions. Therefore, a portion of the incident light beams is not guided to a conventional autofocus sensor, and the photosensitivity of the sensing device is improved. Moreover, the photosensitivity of the top sensing layer is also improved.

The disclosed features may be combined, modified, or replaced in any suitable manner in one or more disclosed embodiments, but are not limited to any particular embodiments.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An camera module, comprising:
    a transparent plate, comprising a bottom surface and a top surface opposite to the bottom surface;
    a top sensing layer, formed on the bottom surface; and
    a light-cutting layer, formed on the top surface, comprising a blocking material and a plurality of transparent apertures penetrating through the blocking material,
    wherein the top sensing layer comprises an invisible-light-cutting film and a plurality of top sensing units penetrating through the invisible-light-cutting film.

2. The camera module as claimed in claim 1, wherein the top sensing units are arranged in sets of two and each set of two top sensing units for use together, wherein each set of two top sensing units comprises a first top sensing unit and a second top sensing unit, the first top sensing unit is configured to generate a first focus signal and the second top sensing unit is configured to generate a second focus signal, wherein a focus value is obtained by a processing module according to the first focus signal and the second focus signal.

3. The camera module as claimed in claim 1, wherein two sets of top sensing units define an invisible-light-cutting zone.

4. The camera module as claimed in claim 3, wherein each of the invisible-light-cutting zones is located under one of the transparent apertures.

5. The camera module as claimed in claim 3, wherein an area of the invisible-light-cutting zone is greater than an area of the transparent aperture.

6. The camera module as claimed in claim 3, wherein a center of the invisible-light-cutting zone is aligned with a center of the transparent aperture.

7. The camera module as claimed in claim 1, wherein the top sensing units are electrically connected to a processing module via a substrate located under the top sensing layer.

8. The camera module as claimed in claim 1, wherein the top sensing units are organic photodiodes, and configured to sense invisible light, wherein the top sensing units connected to a plurality of transparent wires, and the top sensing units are electrically connected to a processing module via the transparent wires.

9. The camera module as claimed in claim 8, wherein the invisible light is infrared light having wavelengths greater than 800 nm.

10. The camera module as claimed in claim 8, wherein the invisible light is ultraviolet light having wavelengths less than 400 nm.

11. The camera module as claimed in claim 8, wherein the transparent wires are made of ITO.

12. The camera module as claimed in claim 8, wherein widths of the top sensing units are about 20 times widths of the transparent wires.

13. The camera module as claimed in claim 1, wherein the sensing device further comprises:
    a sensing layer comprising a plurality of bottom sensing units configured to generate image signals;
    a plurality of filter units disposed on the bottom sensing units; and
    a plurality of microlenses disposed on the filter units,
    wherein the top sensing layer is located over the microlenses.

14. The camera module as claimed in claim 1, further comprising:
    a lens located over the light-cutting layer,
    wherein the top sensing layer comprises a plurality of top sensing units configured to generate focus signals and the lens is moved according to the focus signals.

15. An camera module, comprising:
    a transparent plate, comprising a bottom surface and a top surface opposite to the bottom surface;
    an top sensing layer, formed on the bottom surface, comprising an invisible-light-cutting film and a plurality of top sensing units penetrating through the invisible-light-cutting film; and
    a light-cutting layer, formed on the top surface, comprising a blocking material and a plurality of transparent apertures penetrating through the blocking material,
    wherein the top sensing layer comprises an invisible-light-cutting film and a plurality of top sensing units penetrating through the invisible-light-cutting film.

* * * * *

UNITED STATES PATENT AND TRADEMARK OFFICE
CERTIFICATE OF CORRECTION

PATENT NO. : 10,063,763 B2
APPLICATION NO. : 15/204313
DATED : August 28, 2018
INVENTOR(S) : Chin-Fu Chen and I-Pei Liu

Page 1 of 1

It is certified that error appears in the above-identified patent and that said Letters Patent is hereby corrected as shown below:

On the Title Page (73) Assignee:
Delete "TDK TAIWAN CORP. (Yangmei Taoyuan, TW)"
Insert --VisEra Technologies Company Limited (Hsin-Chu, TW)--

Signed and Sealed this
Twentieth Day of August, 2019

Andrei Iancu
*Director of the United States Patent and Trademark Office*